United States Patent [19]

Fujishima et al.

[11] Patent Number: 4,722,074
[45] Date of Patent: Jan. 26, 1988

[54] SEMICONDUCTOR STORAGE UNIT WITH I/O BUS PRECHARGING AND EQUALIZATION

[75] Inventors: Kazuyasu Fujishima; Masaki Kumanoya; Hideshi Miyatake; Hideto Hidaka; Katsumi Dosaka; Tsutomu Yoshihara, all of Itami, Japan

[73] Assignee: Mitsubishi Denki Kabushiki Kaisha, Tokyo, Japan

[21] Appl. No.: 774,358

[22] Filed: Sep. 10, 1985

[30] Foreign Application Priority Data

Oct. 31, 1984 [JP] Japan .................. 59-231606

[51] Int. Cl.[4] .................. G11C 7/00; G11C 13/00; G11C 11/40

[52] U.S. Cl. .................. 365/203; 365/233; 365/189; 365/230

[58] Field of Search .............. 365/203, 233, 205, 207, 365/208

[56] References Cited

U.S. PATENT DOCUMENTS

| 4,125,878 | 11/1978 | Watanabe | 365/208 X |
|---|---|---|---|
| 4,138,740 | 2/1979 | Itoh | 365/205 |
| 4,417,329 | 11/1983 | Mezawa et al. | 365/233 |
| 4,449,207 | 5/1984 | Kung et al. | 365/189 |
| 4,458,337 | 7/1984 | Takemae et al. | 365/233 |
| 4,475,178 | 10/1984 | Kinoshita | 365/203 X |
| 4,503,522 | 3/1985 | Etoh et al. | 365/203 X |

FOREIGN PATENT DOCUMENTS

| 57-195387 | 12/1982 | Japan | 365/203 |
|---|---|---|---|
| 58-19793 | 2/1983 | Japan | 365/203 |
| 58-182190 | 10/1983 | Japan | 365/203 |
| 59-203298 | 11/1984 | Japan | 365/203 |
| 60-85492 | 3/1985 | Japan | 365/203 |

Primary Examiner—Joseph A. Popek
Assistant Examiner—Alfonso Garcia
Attorney, Agent, or Firm—Lowe, Price, LeBlanc, Becker & Shur

[57] ABSTRACT

A first precharging and equalizing circuit (7) precharges and equalizes I/O buses (10 and 10') in advance to selection of bit lines, and following thereto, a second precharging and equalizing circuit (12) precharges and equalizes the I/O buses (10 and 10') during driving operation of a sense amplifier (2). Thus, potential levels of the I/O Buses (10 and 10') are prevented from being changed by vibration of the output level of the sense amplifier (2) transmitted to the I/O buses (10 and 10') through parasitic capacitance (8) during driving operation of the sense amplifier (2).

6 Claims, 5 Drawing Figures

SEMICONDUCTOR STORAGE UNIT WITH I/O BUS PRECHARGING AND EQUALIZATION

BACKGROUND OF THE INVENTION

1. Field of the Invention

The present invention relates to a semiconductor storage unit and, more particularly, it relates to an improved semiconductor storage unit which can perform readout operation at a high speed.

2. Description of the Prior Art

FIG. 1 shows the structure of a conventional single-transistor type MOS dynamic memory of n rows and n columns. It is to be noted that circuit parts not particularly related to the present invention are omitted from FIG. 1 for convenience of illustration. In FIG. 1, memory cells 1 are arranged in the form of a matrix with n rows and n columns. The memory cells 1 in the respective rows are connected with word lines $WL_1$ to $WL_n$. The dynamic memory as shown in FIG. 1 is the so-called open bit type dynamic memory in which bit lines are connected to both sides of sense amplifiers 2. Therefore, the memory cells 1 of the first to (n/2)th rows are arranged in the left-hand sides of the sense amplifiers 2 while the memory cells 1 of the ((n/2)+1)th to nth rows are arranged in the right-hand sides of the sense amplifiers 2. The respective columns of memory cells 1 arranged in the left-hand sides of the sense amplifiers 2 are connected with bit lines $BL_1$ to $BL_n$. On the other hand, the respective columns of memory cells 1 arranged in the right-hand sides of the sense amplifiers 2 are connected with bit lines $BL_1'$ to $BL_n'$. In the following description, the word lines are generally indicated by symbol WL while the bit lines in the left-hand sides of the sense amplifiers are generally indicated by symbol BL and those in the right-hand sides are generally indicated by symbol BL'.

Each of the memory cells 1 is formed by an access transistor whose gate is connected with the word line WL and a memory capacitance Cs. The word lines WL in the left-hand sides of the sense amplifiers 2 are connected to a row decoder 3 while those in the right-hand sides are connected to a row decoder 3'. These row decoders 3 and 3' are circuits which receive row addresses RA from a timing signal generation circuit 20 for selecting and driving corresponding word lines WL. The sense amplifiers 2 are interposed between the bit lines BL in the left-hand sides and the bit lines BL' in the right-hand sides. These sense amplifiers 2 are adapted to detect and amplify cell information transferred from the memory cells 1 to the bit lines BL and BL'. Column decoders 4 and 4' are adapted to receive column addresses CA from the timing signal generation circuit 20 to select the bit lines BL and BL' connected with prescribed sense amplifiers 2, and the respective outputs thereof are supplied to gates of switching transistors 9 and 9'. The switching transistors 9 and 9' are respectively interposed between the bit lines BL and BL' and I/O buses 10 and 10', thereby to connect the bit lines BL and BL' selected by selection signals from the column decoders 4 and 4' with the I/O buses 10 and 10'. The I/O buses 10 and 10' are connected to an output pre-amplifier 5, which is adapted to differentially amplify the level difference between the I/O buses 10 and 10'. The output of the output pre-amplifier 5 is supplied to an output main amplifier 6, the output of which is supplied to an output pin 11.

The I/O buses 10 and 10' are also connected with a precharging and equalizing circuit 7, which is adapted to precharge and equalize the I/O buses 10 and 10' at supply voltage $V_{CC}$ in advance to selection of the bit lines BL and BL' in order to facilitate high-speed readout operation. Parasitic capacitances 8 are inevitably present between the I/O buses 10 and 10' and the respective bit lines BL and BL'.

The timing signal generation circuit 20 receives a row address strobe signal $\overline{RAS}$out and a column address strobe signal $\overline{CAS}$out from the exterior and a row address signal and a column address signal inputted in a time-sharing manner from an input terminal 20a. In response to the row address strobe signal $\overline{RAS}$out and column address strobe signal $\overline{CAS}$out from the exterior, the timing signal generation circuit 20 output various timing signals or address signals to supply the same to the aforementioned respective circuit blocks.

FIG. 2 is a waveform diagram for illustrating the operation of the circuit as shown in FIG. 1. The operation of the circuit of FIG. 1 is now described with reference to FIG. 2. When the row address strobe signal $\overline{RAS}$out supplied from the exterior to the timing signal generation circuit 20 is turned to a low level, i.e., "0" in logic level, an internal inverted row address strobe signal $\overline{RAS}$ falls and a row address strobe signal RAS rises. In response to the conversion of the row address strobe signal RAS to a high level, an internal row address RA is generated and the states of the row decoders 3 and 3' are determined while one of the word lines $WL_1$ to $WL_n$ is selected by a word line driving signal WS. Information in the memory cell 1 connected with the selected word line WL is transmitted to the bit line BL (or BL'). At this time, reference information is transmitted to the bit line BL' (or BL) on the opposite side with respect to the sense amplifier 2 from a dummy memory cell (not shown) having capacitance substantially half the memory capacitance Cs through a dummy word line (not shown). Then a sense amplifier driving signal $\phi_S$ rises whereby the sense amplifier 2 differentially amplifies a very small potential difference caused between the bit lines BL and BL'.

In the timing signal generation circuit 20, an internal inverted column address strobe signal $\overline{CAS}$ falls and a column address strobe signal CAS rises in response to the fall of the column address strobe signal $\overline{CAS}$out from the exterior. An internal column address CA is generated and the states of the column decoders 4 and 4' are determined in response to the conversion of the column address strobe signal CAS to a high level. A signal $\phi_Y$ supplied from the timing signal generation circuit 20 to the respective column decoders 4 and 4' is a column selection signal for making conductive the switching transistors 9 and 9' connected with the bit lines BL and BL' selected by the column address CA. Therefore, generation of the column selection signal $\phi_Y$ is performed by AND of the column address CA and the sense amplifier driving signal $\phi_S$ since it must be generated after the determination of the selected bit lines in the column decoders 4 and 4' and the determination of the bit line potential by the sense amplifier 2. When the column selection signal $\phi_Y$ makes prescribed bit lines BL and BL' communicate with the I/O buses 10 and 10', the sense amplifier 2 responds to the difference in potential between the I/O buses 10 and 10' precharged at the same potential level. However, such potential transition is not rapidly performed since the load capacity of the I/O buses 10 and 10' is much greater than the driving ability of the sense amplifier 2.

The precharging and equalizing operation of the I/O buses 10 and 10' is terminated when the inverted column address strobe signal $\overline{CAS}$ is turned to a low level. However, in the case where the precharging and equalizing operation of the I/O buses 10 and 10' is terminated before generation of the sense amplifier driving signal $\phi_S$ as shown in FIG. 2, the levels of the I/O buses 10 and 10' are unbalanced by capacitive coupling by the parasitic capacitance 8 following transition of most of the bit lines in one side of the sense amplifiers 2 from high levels to low levels if most of the memory cells connected to the selected word lines store the logic "0" (low level). In other words, oscillation in the output level of the sense amplifier 2 is transmitted through the parasitic capacitance 8 to the I/O bus 10 or 10', whereby the level of the I/O bus 10 or 10' is changed from the precharge potential. Therefore, the potential difference is already caused between the I/O buses 10 and 10' when the column selection signal $\phi_Y$ rises at timing t1 as shown in FIG. 2 whereby the selected bit lines are connected with the I/O buses 10 and 10'. If the potential difference is inverted in polarity from the potential difference between the bit lines BL and BL' differentially amplified by the sense amplifier 2, considerable time is required until the potential difference between the I/O buses 10 and 10' reaches a level exceeding the sensitivity of the output pre-amplifier 5 (timing t2 as shown in FIG. 2). Therefore, the timing for initiating amplification of the level difference between the I/O buses 10 and 10' in the output pre-amplifier 5, which timing is determined by rise of a driving signal $\phi_{PA}$, must be held for a considerable time from the timing t1. Thus, generation of a driving signal $\phi_{MA}$ for the output main amplifier 6 is delayed by the said time to delay the access time.

"IEEE Journal of Solid-State Circuits" Vol. SC-15, No. 5, October 1980, pp. 846–855 is known as literature relating to coupling noise to I/O buses caused by parasitic capacitance in the operation of sense amplifiers.

In the conventional semiconductor storage unit as hereinabove described, the access time must be determined in consideration of the unbalance caused in the potential levels of the I/O buses 10 and 10' when the precharging and equalizing operation of the I/O buses 10 and 10' is terminated before driving of the sense amplifiers 2, whereby the read-out operation cannot be performed at a high speed.

SUMMARY OF THE INVENTION

Accordingly, a principal object of the present invention is to provide a semiconductor storage unit which can stably perform read-out operation of memory cells at a high speed.

Briefly stated, the present invention provides a semiconductor storage unit which comprises a plurality of memory cells arranged in the form of a matrix along directions of rows and columns, word lines connected with the respective rows of memory cells, bit lines connected with the respective columns of memory cells, sense amplifiers for detecting and amplifying cell information transmitted from the memory cells to the bit lines in response to selection of the word lines, I/O buses connected to selected bit lines in response to the selection of the bit lines and a first precharge means for precharging the holding potential levels of the I/O buses in advance of the selection of the bit lines, with further provision of a second precharge means for precharging the holding potential levels of the I/O buses by the supply voltage during the driving operation of the sense amplifier.

The present invention is so structured that the I/O buses are precharged during the driving operation of the sense amplifier, whereby coupling noise to the I/O buses caused following the operation of the sense amplifier by parasitic capacitance is removed to enable stable read-out operation at a high speed.

The above and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
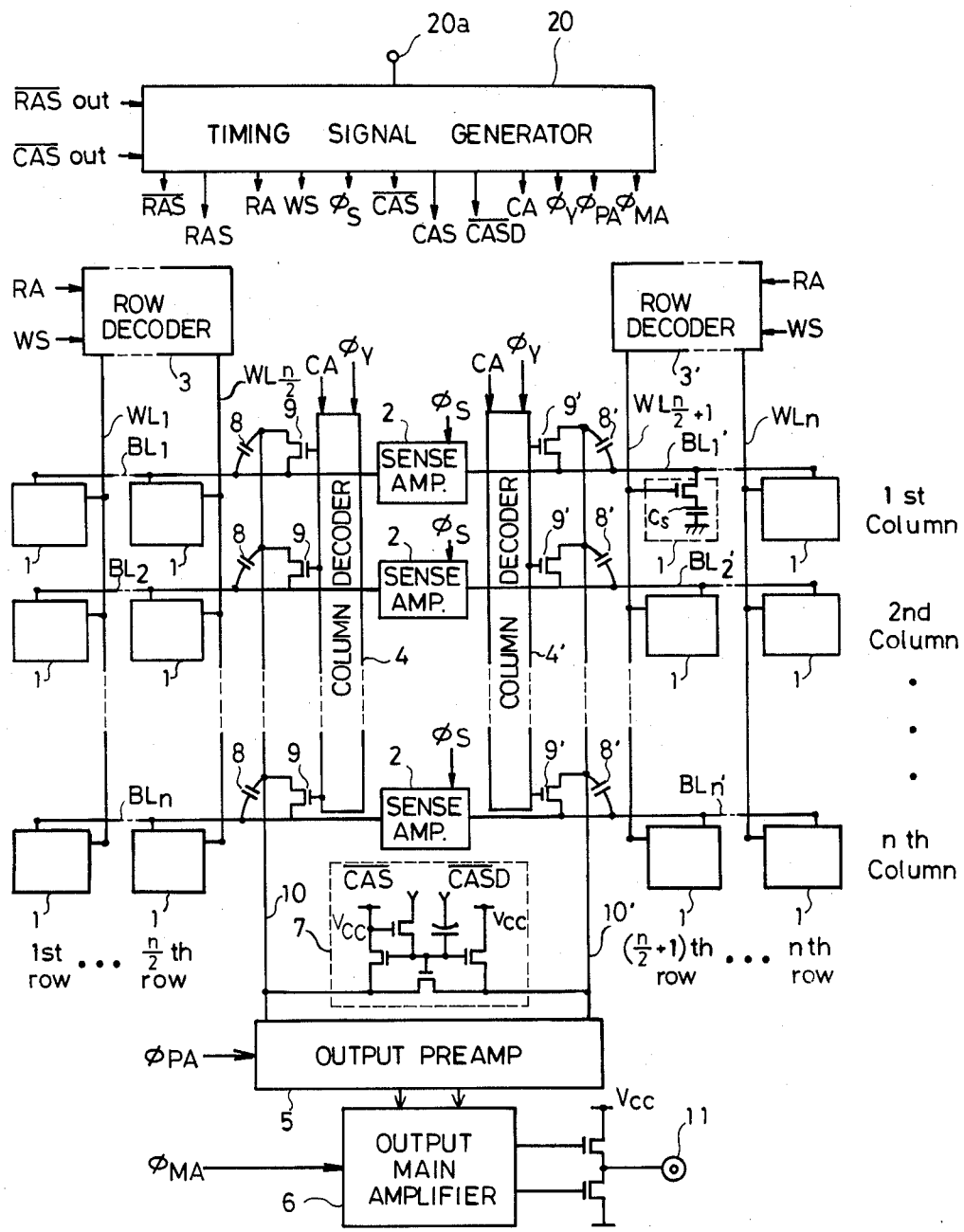
FIG. 1 is a circuit diagram showing a conventional semiconductor storage unit.
Figure 2:
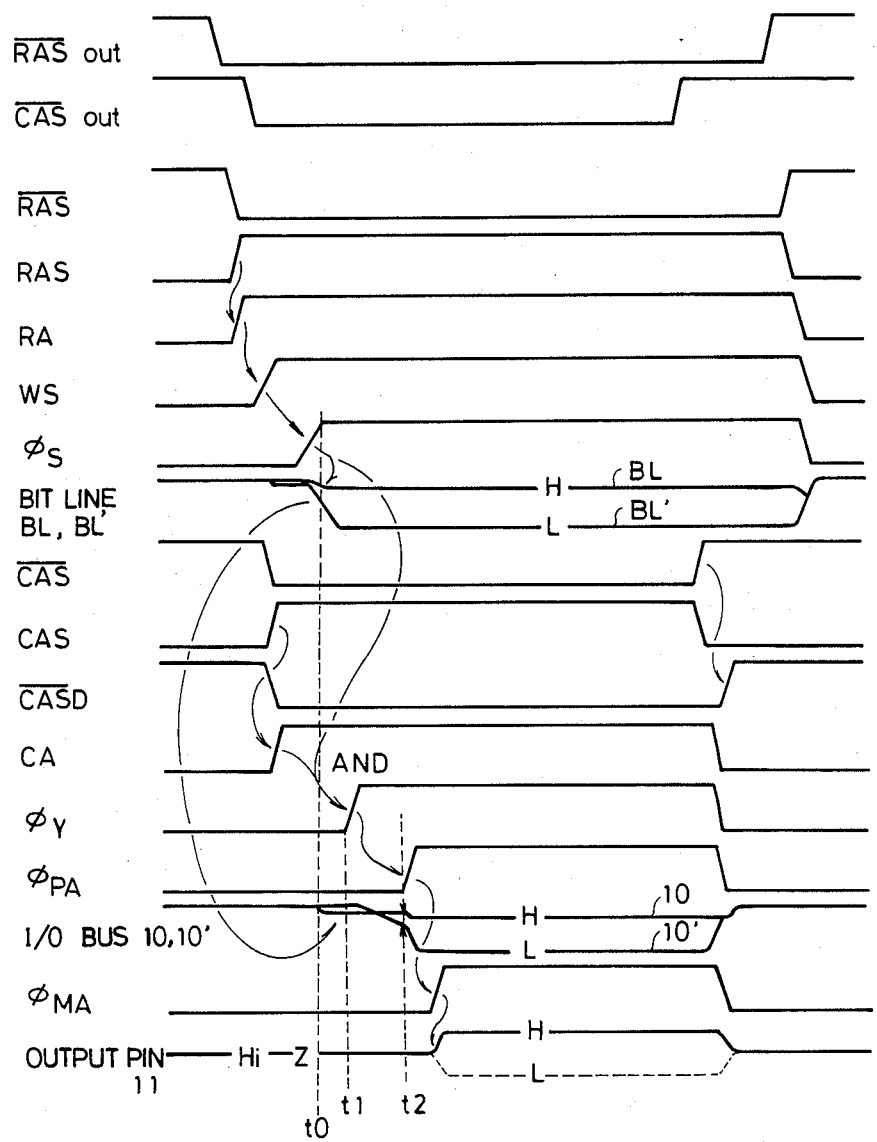
FIG. 2 is a waveform diagram for illustrating the operation of the conventional semiconductor storage unit as shown in FIG. 1.
Figure 3:
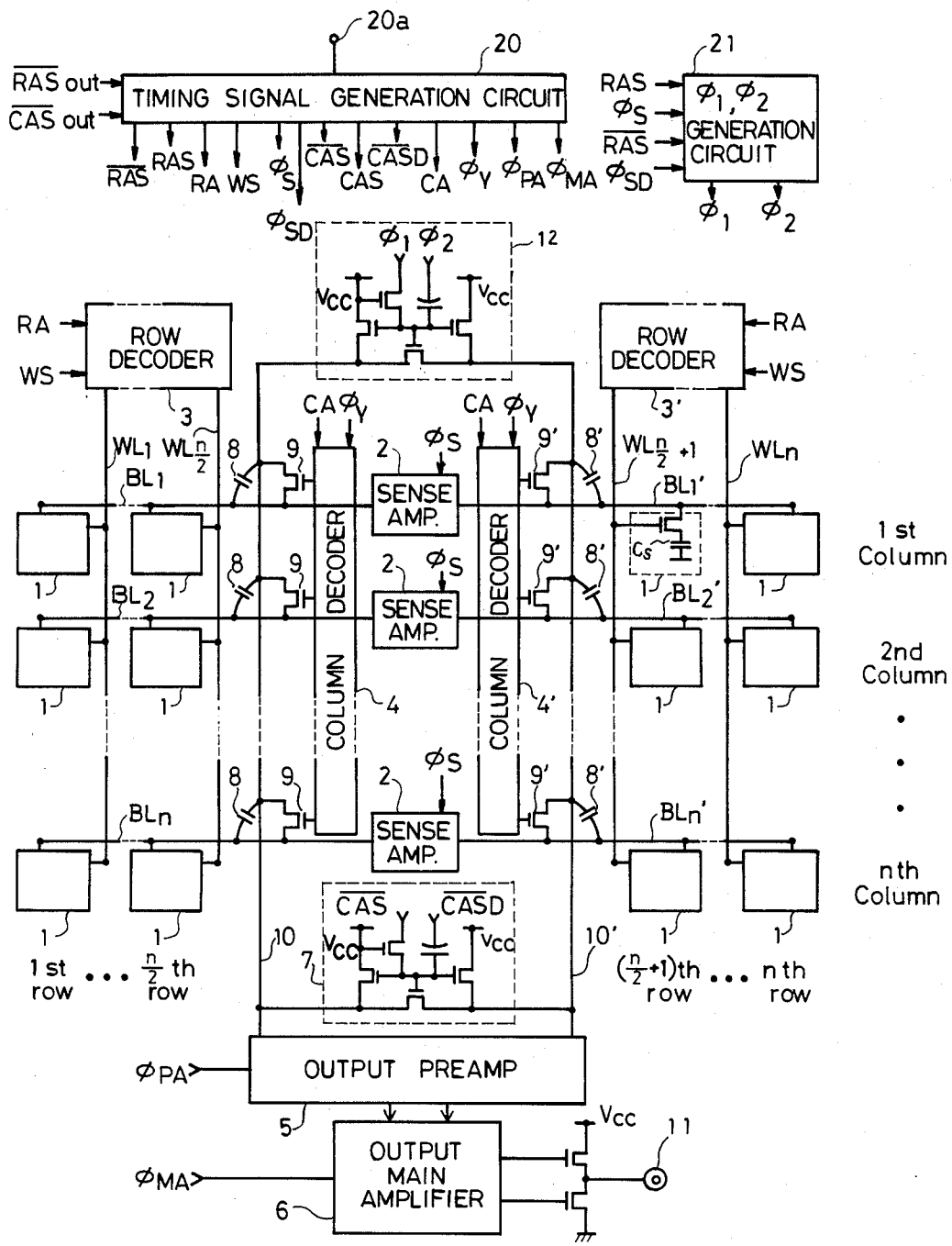
FIG. 3 is a circuit diagram showing an embodiment of the present invention.

FIG. 3 is a circuit diagram showing a semiconductor storage unit according to an embodiment of the present invention. In the circuit as shown in FIG. 3, components similar to those in FIG. 1 are indicated by the same reference numerals and detailed description thereof is omitted. The feature of the embodiment as shown in FIG. 3 resides in provision of a second precharging and equalizing circuit 12 which is completely identical in structure to a precharging and equalizing circuit (hereinafter referred to as first precharging and equalizing circuit) 7. The second precharging and equalizing circuit 12 is adapted to precharge and equalize I/O buses 10 and 10' during driving operation of sense amplifiers 2, and is driven by timing signals $\phi_1$ and $\phi_2$ received from a $\phi_1$ and $\phi_2$ generation circuit 21. The $\phi_1$ and $\phi_2$ generation circuit 21 is adapted to generate the timing signals $\phi_1$ and $\phi_2$ on the basis of a row address strobe signal $\overline{RAS}$, a sense amplifier driving signal $\phi_S$, an inverted row address strobe signal RAS and a delayed sense amplifier driving signal $\phi_{SD}$ obtained by delaying the sense amplifier driving signal $\phi_S$ by a prescribed time.

Figure 4:
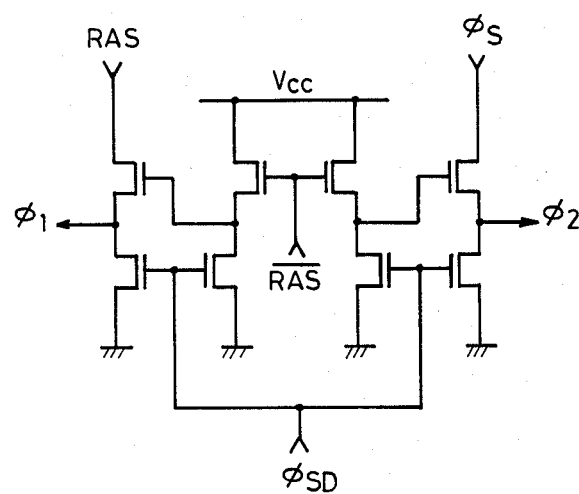
FIG. 4 is a circuit diagram showing a preferred example of a $\phi_1$ and $\phi_2$ generation circuit as shown in FIG. 3.
Figure 5:
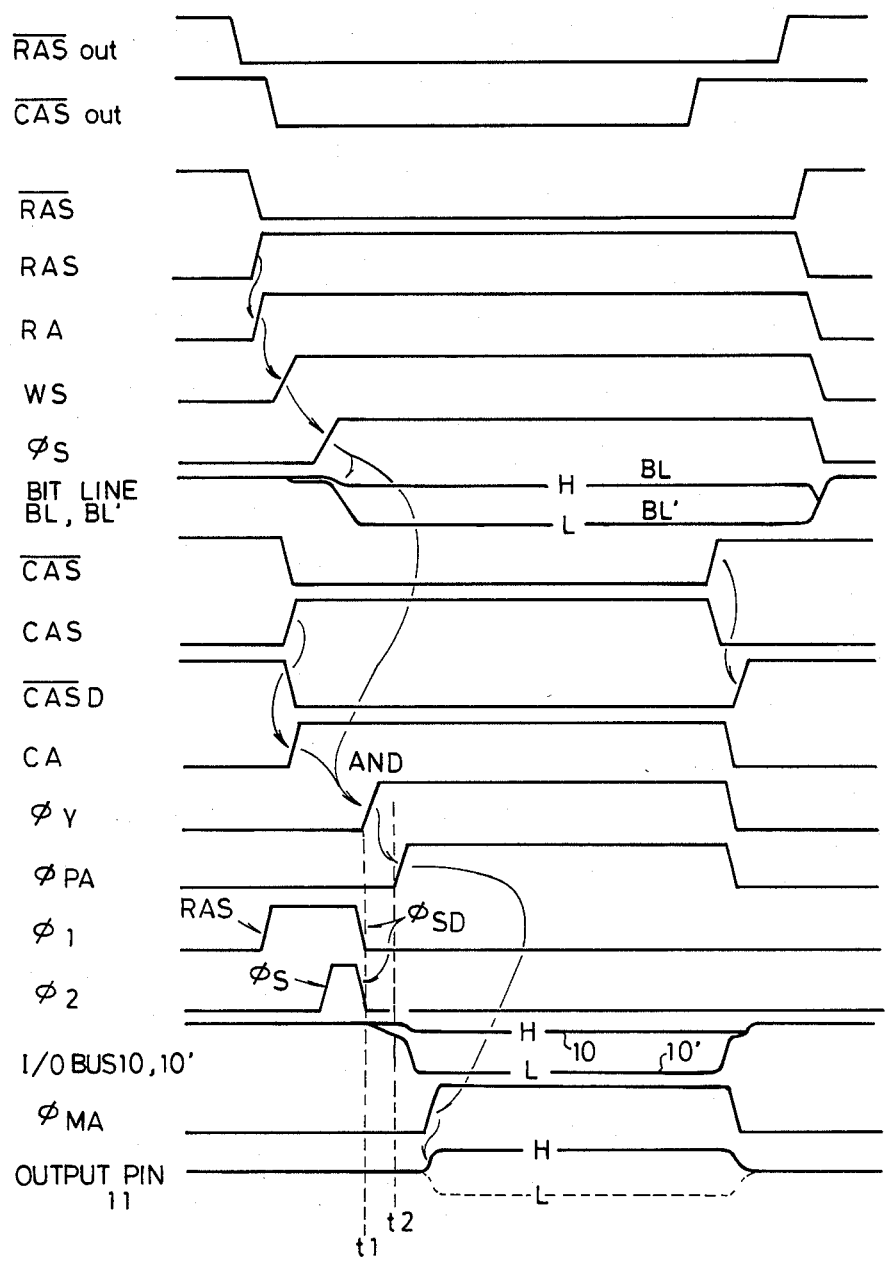
FIG. 5 is a waveform diagram for illustrating the operation of the embodiment as shown in FIG. 3.

FIG. 5 is a waveform diagram for illustrating the operation of the embodiment as shown in FIG. 3. Referring now to FIG. 5, the operation of the circuit in FIG. 3 is described. As shown in FIG. 5, the timing signal $\phi_1$ rises in response to rise of the row address strobe signal $\overline{RAS}$ and falls in response to the delayed sense amplifier driving signal $\phi_{SD}$. The timing signal $\phi_2$ rises in response to rise of the sense amplifier driving signal $\phi_S$ and falls in response to the delayed sense amplifier driving signal $\phi_{SD}$. FIG. 4 shows an example of circuit structure of the $\phi_1$ and $\phi_2$ generation circuit 21 for generating the timing signals $\phi_1$ and $\phi_2$. It is to be noted that the circuit structure of the $\phi_1$ and $\phi_2$ generation circuit 21 is not restricted to that shown in FIG. 4, and may be modified in various manners. The operation of the circuit as shown in FIG. 4 may be obvious for those skilled in the art, and the explanation thereof is omitted.

As clearly understood from the foregoing description, the timing signals $\phi_1$ and $\phi_2$ remain at high levels when the sense amplifier 2 is driven, and are turned to low levels in advance of rise of a column selection signal $\phi_Y$. The timing signal $\phi_2$ rises in a slight delay from the rise of the timing signal $\phi_1$. The second precharging and equalizing circuit 12 connects the I/O buses 10 and 10' with a power supply $V_{CC}$ when both of the timing signals $\phi_1$ and $\phi_2$ are at high levels, i.e., when the sense amplifier 2 is driven, for precharging and equalizing the I/O buses 10 and 10'. Therefore, noise transmitted to the I/O buses 10 and 10' through the parasitic capacitance 8 in driving of the sense amplifier 2 is removed, whereby the I/O buses 10 and 10' remain at the same levels until bit lines BL and BL' are selected. Thus, the time interval (t2−t1) from the rise of the column selection signal $\phi_Y$ at time t1 in FIG. 5 to make the I/O buses 10 and 10' communicate with the bit lines BL and BL' to establishment of the level difference between the I/O buses 10 and 10' to a level exceeding the sensitivity of an output pre-amplifer 5 (time t2 in FIG. 5) is greatly reduced in comparison with the circuit shown FIG. 1. Consequently, the time for initiating the operation of the output pre-amplifier 5 and an output main amplifier 6 can be quickened thereby to reduce the access time. Thus, the read-out operation can be stably performed at a high speed.

Although the aforementioned description of the embodiment has been made on the so-called open bit line system in which the bit lines BL and BL' are connected to both sides of the sense amplifiers 2, the present invention can also be applied to a folded bit line system in which each bit line is connected to one side of the sense amplifier. Folded bit line memory systems are disclosed in Karp et al., U.S. Pat. No. 4,025,907, and Itoh, U.S. Pat. No. 4,044,340, both of these references being incorporated herein by reference.

Two precharging and equalizing circuits are provided in the aforementioned embodiment, whereas precharging and equalizing operation in a normal state and that for driving the sense amplifier can be performed by one precharging and equalizing circuit by supplying the inverted column address strobe signal $\overline{CAS}$ and a delayed signal $\overline{CASD}$ thereof as well as supplying the timing signals $\phi_1$ and $\phi_2$ to the one precharging and equalizing circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor storage unit comprising:
   a plurality of memory cells arranged in the form of a matrix along directions of rows and columns;
   a plurality of word lines commonly connected with every row of said memory cells;
   a plurality of bit lines commonly connected with every column of said memory cells;
   sense amplifiers for detecting and amplifying cell information transmitted from said memory cells to said bit lines in response to selection of said word lines;
   I/O buses connected to selected ones of said bit lines in response to selection of said bit lines;
   first precharge means for precharging said I/O buses by the supply voltage prior to said selection of said bit lines; and
   second precharge means for precharging said holding potentials of said I/O buses for supply voltage during driving operation of said sense amplifiers.

2. A semiconductor storage unit in accordance with claim 1, wherein said memory cells are single-transistor type MOS dynamic memory cells.

3. A semiconductor storage unit in accordance with claim 1, wherein said second precharge means precharges said I/O buses for a prescribed period of time from the leading edge of a driving signal for said sense amplifiers.

4. A semiconductor unit in accordance with claim 3, wherein said second precharge means includes:
   a timing signal producing circuit for producing a first timing signal which rises in response to an address strobe signal for said word lines and falls in response to a delayed signal of said driving signal for said sense amplifiers and a second timing signal which rises in response to said driving signal for said sense amplifiers and falls in response to said delayed signal of said driving signal for said sense amplifiers, and
   a precharge circuit for precharging said I/O buses when both of said first and second timing signal produced by said timing signal producing circuit are at high levels.

5. A semiconductor unit in accordance with claim 4, wherein said first precharge means and said second precharge means are commonly used at a portion corresponding to said precharge circuit, said precharge circuit receiving signals for determining selection timing of said bit lines and said first and second timing signals.

6. A semiconductor storage unit in accordance with claim 1, wherein said semiconductor storage unit is in an open bit line system in which said bit lines are connected to both sides of said sense amplifiers.

* * * * *